United States Patent [19]
Attwood

[11] 4,178,556
[45] Dec. 11, 1979

[54] CLASS D AMPLIFIER SYSTEM

[76] Inventor: Brian E. Attwood, Sestri 49, Smithbarn Horsham, Sussex RH13 6DS, England

[21] Appl. No.: 897,699

[22] Filed: Apr. 19, 1978

[30] Foreign Application Priority Data

Apr. 22, 1977 [JP] Japan .............................. 52/50399[U]

[51] Int. Cl.² ............................................. H03F 3/38
[52] U.S. Cl. ...................................... 330/10; 330/251; 330/207 A; 330/302
[58] Field of Search ..................... 330/10, 251, 207 A, 330/302

[56] References Cited
U.S. PATENT DOCUMENTS 4,021,745  5/1977  Suzuki et al. .......................... 330/10
4,059,807  11/1977 Hamada ................................. 330/10

Primary Examiner—Lawrence J. Dahl
Attorney, Agent, or Firm—Harris, Kern, Wallen & Tinsley

[57] ABSTRACT

In a Class D amplifier system comprising a pulse width modulator for pulse width modulating with an audio signal a carrier signal having a frequency higher than that of the audio signal, an output switching amplifier connected to the modulator, and a lowpass filter connected to the output amplifier to supply a demodulated audio signal to a load in which a trap circuit resonant at a carrier signal frequency is provided in the lowpass filter to permit part of an output signal from the trap circuit which is free from a carrier signal component to be negative-fed back to the pulse width modulator.

4 Claims, 1 Drawing Figure

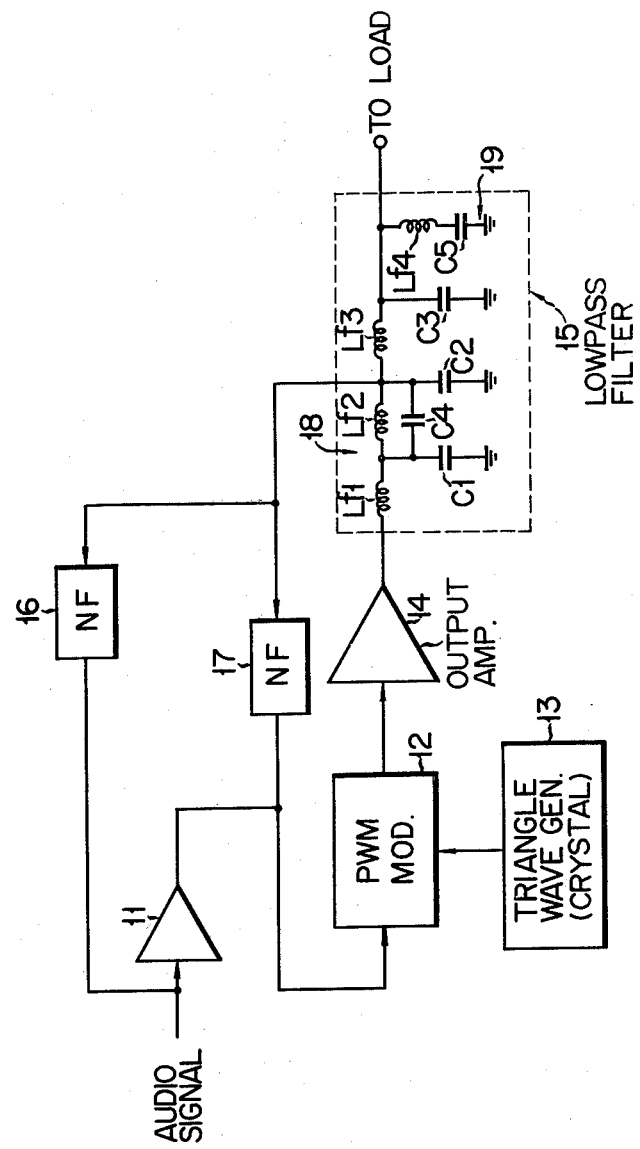

CLASS D AMPLIFIER SYSTEM

This invention relates to a Class D amplifier.

A Class D amplifier is known as a high efficient amplifier, which pulse width modulates with an audio signal a pulse signal having a frequency higher than that of an audio signal and demodulates a resultant pulse modulated signal to cause a loudspeaker to be driven.

The object of this invention is to provide a Class D amplifier system of low distortion.

According to this invention there is provided a Class D amplifier system comprising an audio amplifier for amplifying an audio signal; a carrier signal source; a pulse width modulator for pulse width modulating a carrier signal from the carrier signal source by an output signal of the audio amplifier; an output amplifier connected to the pulse width modulator for amplifying a pulse width modulated signal; a lowpass filter connected to the output amplifier to apply a recovered audio signal to a load; a trap circuit arranged in the lowpass filter to resonate at a carrier signal frequency; and means for permitting part of an output voltage from the trap circuit to be negative-fed back to the pulse width modulator.

This invention can be more fully understood from the following description when taken in connection with the accompanying drawing, in which:

The FIGURE is a schematic block diagram showing a Class D amplifier system according to this invention.

In a Class D amplifier, as will be shown in the drawing, an audio input signal is amplified by an amplifier 11 and then it is supplied to a pulse width modulator (PWM) 12. A triangle-wave carrier signal with a frequency of, for example, 430 KHz is supplied from a triangle-wave oscillator 13 to the pulse width modulator 12. The pulse width modulator 12 may be constructed of a level comparator and adapted to compare the level of the audio signal with that of the reference triangle-wave signal to generate a rectangular-wave pulse width modulated signal whose pulse width varies according to the instantaneous amplitude level of the modulating audio signal. The pulse width modulated signal is amplified by an output amplifier 14. The output amplifier 14 may be constructed of a pair of switching devices which are alternately switched ON and OFF in response to the pulse width modulated input signal. A lowpass filter 15 is connected between the output amplifier 14 and a load such as a loudspeaker, and supplies to the load a demodulated audio signal. Part of the output voltage is taken out of the lowpass filter and then negative-fed through a negative feedback circuit network (NF) 16 back to the audio amplifier 11 and through a negative feedback circuit network 17 back to the pulse width modulator 12, thereby making the system stable and attaining an improvement of distortion.

In the drawing, the lowpass filter is comprised of choke coils $Lf_1$ and $Lf_3$ and capacitors $C_1$, $C_2$ and $C_3$ and adapted to eliminate the ripple component of the carrier signal frequency of the oscillator 13. If the ability of the lowpass filter to eliminate high frequency ripple component is insufficient, such high frequency ripple component is fed back to the audio amplifier 11 and pulse width modulator 12, thus giving a cause for distortion. When, for example, high frequency ripple component is fed back to the pulse width modulator, it would be impossible to obtain a desired pulse width according to the instantaneous amplitude of the audio signal.

In this invention, a parallel resonance circuit, i.e. a trap circuit, is provided to sufficiently eliminate a high frequency ripple component. That is, the parallel resonance circuit 18 comprising a choke coil $Lf_2$ and capacitor $C_4$ and adapted to resonate at the output frequency of the oscillator 13 is connected between the choke coils $Lf_1$ and $Lf_3$. Part of the output voltage is taken out of a junction between the choke coils $Lf_3$ and $Lf_2$ and fed back to the audio amplifier 11 and pulse width modulator 12 through the negative feedback circuits 16 and 17. Since, due to the trap circuit, high frequency ripple component can be sufficiently eliminated, object of the negative feedback can be fully attained.

Further, if the oscillator 13 is constructed of a crystal controlled oscillator of which the oscillation frequency is sufficiently stable, then it becomes possible to elevate the selectivity of resonance circuit 18. As a result, the high-frequency ripple eliminating capability is more enhanced.

At the output side of the lowpass filter 15 a series resonance circuit 19 may be provided which comprises a choke coil $Lf_4$ and capacitor $C_5$ and resonates by the carrier signal frequency. By provision of the trap circuit 19, high frequency ripple component can be prevented from being radiated externally thorugh connection lines between the lowpass filter and the load.

What is claimed is:

1. A Class D amplifier system comprising:
    an audio amplifier for amplifying an audio signal;
    a carrier signal source;
    a pulse width modulator for pulse width modulating a carrier signal from said carrier signal source by an output signal of said audio amplifier;
    means connecting the output of said audio amplifier and the output of said carrier signal source to said pulse width modulator as inputs;
    an output amplifier having an input connected to the output of said pulse width modulator for amplifying a pulse width modulated signal;
    a low pass filter having an input connected to the output of said output amplifier to apply a recovered audio signal to a load;
    a trap circuit arranged in said lowpass filter to resonate at a carrier signal frequency; and
    negative feed-back circuit means connecting an output voltage from said trap circuit as input to said pulse width modulator.

2. A Class D amplifier system according to claim 1, in which said carrier signal source is comprised of a crystal oscillator.

3. A Class D amplifier system according to claim 1, in which said trap circuit is a parallel resonance circuit comprising a coil and a capacitor which is connected between the output of said output amplifier and said load.

4. A Class D amplifier system according to claim 1, further comprising a series resonance circuit connected between the output of said lowpass filter and ground and adapted to resonate at the carrier signal frequency.

* * * * *